METHOD OF MAKING A FLAT FLEXIBLE CABLE TERMINATION

Filed March 31, 1958 4 Sheets-Sheet 1

Harold W. Lalmond
Thomas A. Nalette
INVENTORS

Harold W. Lalmond
Thomas A. Nalette
INVENTORS

Dec. 25, 1962 H. W. LALMOND ET AL 3,069,753

METHOD OF MAKING A FLAT FLEXIBLE CABLE TERMINATION

Filed March 31, 1958 4 Sheets-Sheet 3

Harold W. Lalmond
Thomas A. Nalette
*INVENTORS*

METHOD OF MAKING A FLAT FLEXIBLE CABLE TERMINATION

Harold W. Lalmond
Thomas A. Nalette
*INVENTORS*

3,069,753
METHOD OF MAKING A FLAT FLEXIBLE CABLE TERMINATION

Harold W. Lalmond, Nashua, N.H., and Thomas A. Nalette, East Pepperell, Mass., assignors to Sanders Associates, Inc., Nashua, N.H., a corporation of Delaware Filed Mar. 31, 1958, Ser. No. 725,283
1 Claim. (Cl. 29—155.55)

The present invention relates to printed circuit articles, such as flexible cabling utilizing copper conductors bonded to a wide range of plastic materials. More particularly, this invention relates to flexible printed circuit cable terminations.

Typically, flexible printed circuit cables are formed from flat, relatively thin sheets of plastic material, having embedded therein flat, thin conductors all in the same plane or, at most, in a few superimposed planes. In one form of such cable, the conductors are of uniform width and are separated uniformly. The present invention is directed to an improvement in such printed circuits by providing a solution for the problems arising from wiring and soldering connections to a wide range of electrical devices. In the past, the wiring of electrical systems having a number of connections required the wire to be stripped, bent around the terminals and soldered. Then, too, in complicated systems it is difficult to avoid wiring errors. Many of these problems have been simplified to some extent by the use of printed circuit techniques which provide pre-connected assemblies. Such printed circuits generally take the form of relatively rigid dielectric boards having conductors bonded to one or more surfaces thereof. While such an arrangement is suitable for certain electrical and electronic applications, it cannot be used to replace conventional wiring where length and flexibility are essential.

It is, therefore, an object of the present invention to provide an improved, flexible, printed circuit article adapted for simplified engagement with the terminals of an electrical component.

It is a further object of this invention to provide an improved, flexible, printed circuit cable.

Yet another object of this invention is to provide an improved, flexible, printed circuit cable adapted for unusually rugged terminal connections.

A still further object of the present invention is to provide a method of manufacturing an improved printed circuit article.

In accordance with the present invention, there is provided a printed circuit article, comprising a flat, flexible, printed circuit cable, having embedded therein a plurality of conductors. On the conductors are exposed terminals so formed that certain of the terminals are exposed on one flat face of said cable and others are exposed on the opposite flat face of said cable to facilitate the engagement of the conductor terminals with a connector having spaced rows of terminals.

As used herein, the term "plastic" includes a synthetic organic material of high molecular weight and which, while solid in the finished state, at some stage in its manufacture is soft enough to be formed into shape by some degree of flow.

The term "Kel-F" as used herein is the trademark of the M. W. Kellogg Company and refers to the plastic polymer tri-fluoro-chloro-ethylene as manufactured by them.

The term "Teflon," as used herein, is the trademark of the E. I. du Pont de Nemours Company, Inc., and refers to the plastic polymer tetra-fluoro-ethylene as manufactured by them.

The term "ethylene" includes all those plastic materials containing an ethylene radical and the term "vinyl" includes all those plastic materials containing a vinyl radical.

The term "Saran," trademark of the Dow Chemical Company, is used herein to denote those plastic materials containing a vinylidine radical.

The term nylon as used herein refers generically to the group of plastic materials known as polyamides.

For a better understanding of the present invention, together with other and further objects thereof, reference is made to the following description taken in connection with the accompanying drawings and its scope will be pointed out in the appended claim.

In the drawings:

FIG. 1 is a perspective view of a multiple conductor connector and printed circuit cable termination embodying the present invention;

FIG. 1*a* is an enlarged perspective view, partially in section of the multiple conductor connector and printed circuit cable termination of FIG. 1;

Figure 1:
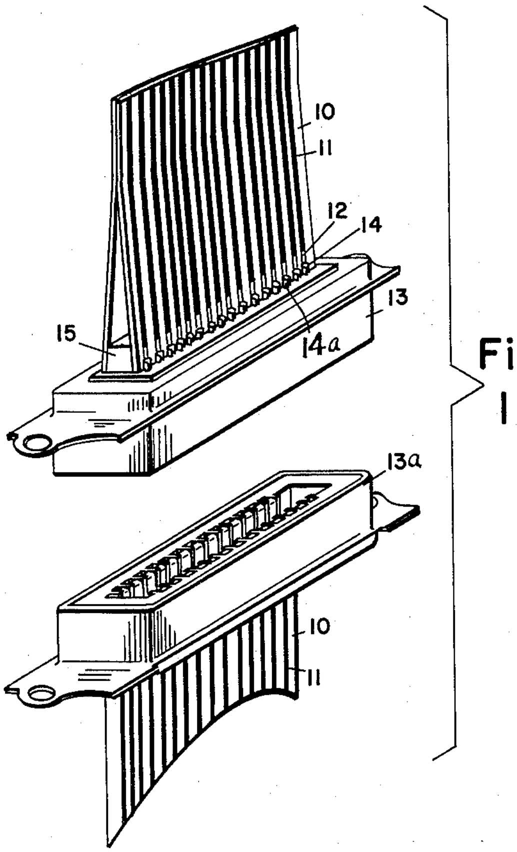
Figure 1A:
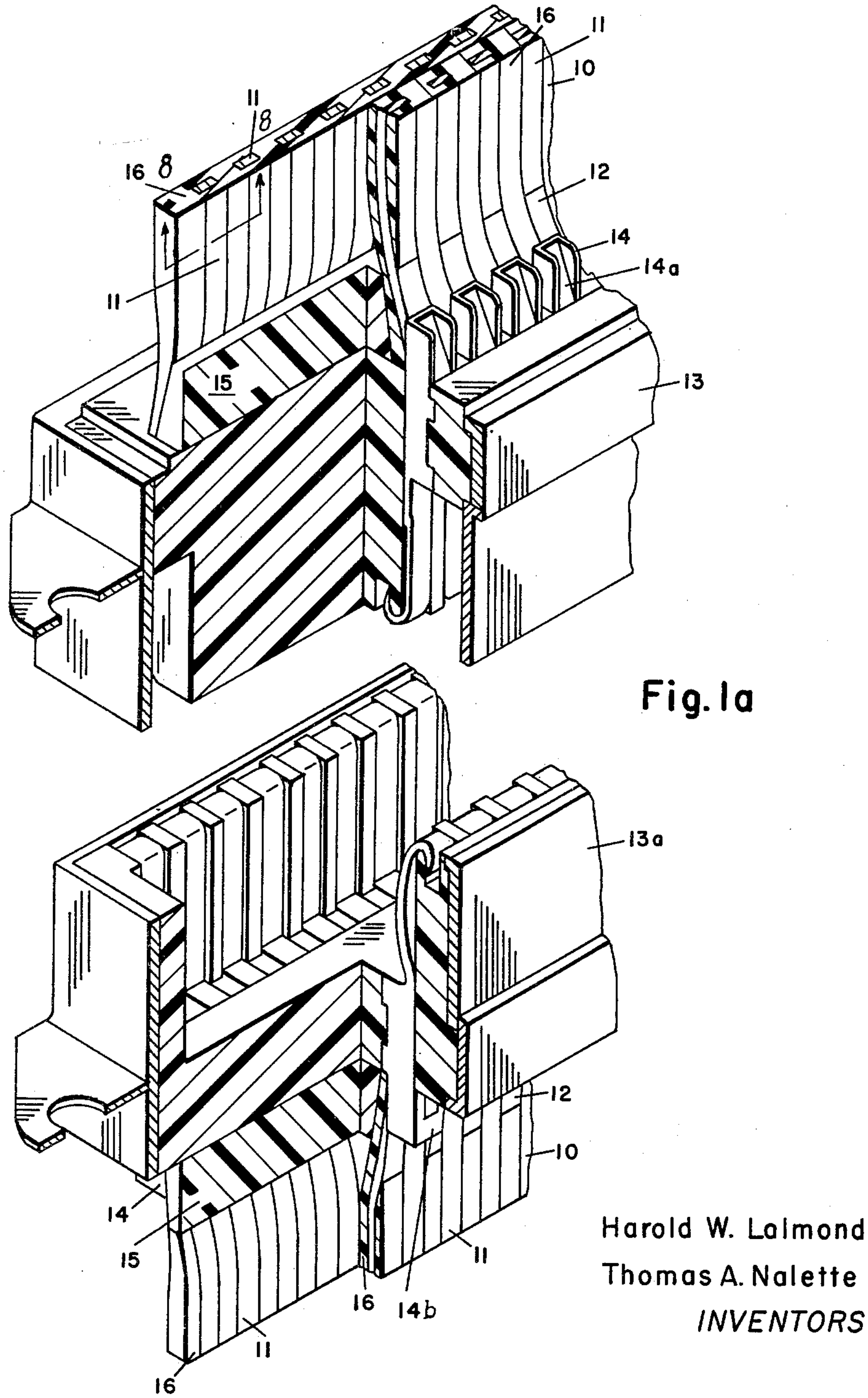
Figure 7:
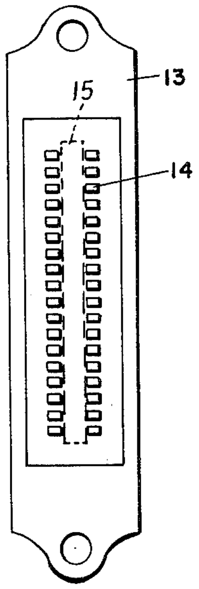
FIG. 7 is a plan view of a multiple conductor connector illustrating a typical terminal configuration.

Referring now to FIG. 1 of the drawings, there is here shown a flat, flexible, printed circuit cable 10, having conductors 11 and terminals 12. The configuration of the terminals 12 is chosen to facilitate engagement with an electrical component which, for convenience, is illustrated as a multiple conductor connector having a male portion 13 and a female portion **13*a*. A connector of this type is shown in "Tele-Tech," November 1954, page 27. It should be noted that the ends of terminals 14** as shown in FIGS. 1, 1*a* and 7 are more massive than the flat apertured soldering tabs depicted in the above-noted publication.

An important feature of the invention lies in the conductor and terminal configuration of the cable 10. Here, the parallel conductors 11 are spaced so as to provide the terminals 12 in register with corresponding connector terminals 14. The conductor terminals 12 are formed by baring the conductors 11 of all insulation to expose a conductive area. A spacing block 15 is provided to facilitate engagement of the conductor terminals 12 with the connector terminals 14. After positioning the conductor terminals 12 with respect to the connector terminals 14, the conductor terminals 12 may be secured to, and brought into permanent electrical contact with, the connector terminals 14 by means of solder *14a*. The solder *14a* may be either manually applied or applied with the use of dip or fountain soldering techniques. The solder *14a* flows into channeled terminals and through apertures, not shown, to the conductor terminals 12. The wiring errors that frequently occur in conventional terminal techniques are essentially eliminated with the printed circuit cable and connector shown in FIG. 1. Additionally, it affords a more rugged assembly, a saving of space, greater flexibility and a neater appearance.

Figure 2:
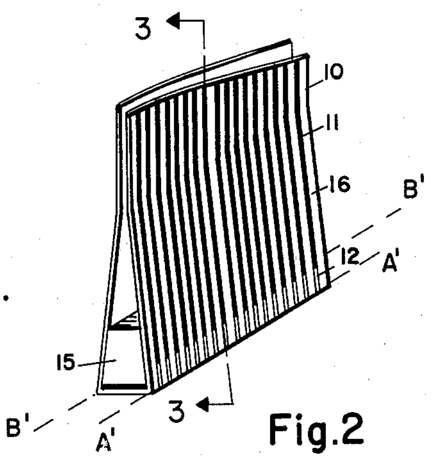
FIG. 2 is a perspective view of the printed circuit cable and terminal in FIG. 1.

Referring now to FIG. 2, there is here illustrated a printed circuit cable embodying the terminal structure of the present invention. The cable 10 comprises a unitary, flat, plastic laminate 16 encapsulating the conductors 11. In the structure of FIG. 2 the plastic portion of the cable 10 is in turn laminated to a spacing block 15 in order to more firmly maintain the cable in the position shown. The exposed terminals 12 on conductors 11 are thus fixed in rows lying on opposite sides of the spacing block 15.

The configuration of FIG. 2 may be formed in several ways. One method of achieving this structure is to utilize a single length of cable 10 having parallel conductors 11 embedded therein. The cable length 10 is folded along the lines A—A′ and B—B′ over the spacing block 15. The terminals 12 may then be formed by, for example grinding away the outer layer of insulating material 16 and the conductors 11 in the area between the fold lines A—A′ and B—B′, and exposing the conductor ends at the outer upper and outer lower surface of the fold. The inner layer of insulation which forms the inner arc of the fold is left intact to reinforce the terminal structure. It should of course be noted that the afore-mentioned fold need not be made at the middle of the cable's length. The upper and lower layers of cable 10 may be connected to electrical devices that are at varying distances from the connectors 13 and *13a*.

Figure 3:
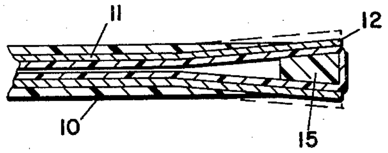
FIG. 3 is a cross-sectional view of the printed circuit cable and terminal of FIG. 2 taken along the line 3—3.

FIG. 3 is a cross-sectional view, more especially illustrating this structural relationship of the terminals 12, spacing block 15 and conductors 11.

Figure 5:
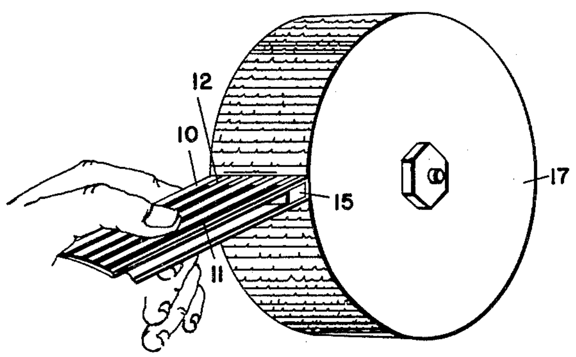
FIG. 5 is a perspective view of a folded printed circuit cable and abrasive wheel illustrating a step in forming the terminal structure of the present invention.

The grinding operation may readily be accomplished by the use of an abrasive wheel 17 as illustrated in FIG. 5.

Figure 4:
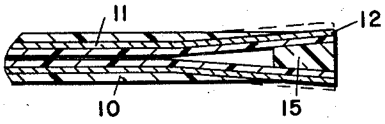
FIG. 4 is a cross-sectional view of a printed circuit cable and terminal similar to that of FIG. 3.

If the spacing block 15 is made of appropriate material the same as the insulation 16, it may be autogenously welded to the insulation 16 under heat and pressure to form a unitary structure. This structure may in turn be ground on an abrasive wheel 17 to form the terminal and spacing block arrangement illustrated in cross section in FIG. 4. Here the conductors 11 and cable insulation 16 are completely ground away at the edge of the spacing block. The strength of this structure resides in the adherence of the cable insulation 16 to the faces of the spacing block 15. This same abrasive method is then used to form the terminals 12 at the outer upper surface and outer lower surface of the spacing block 15.

Figure 6:
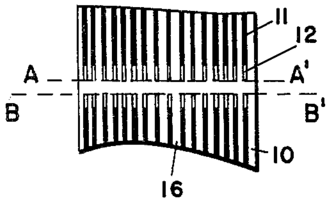
FIG. 6 is a plan view of a preformed terminal structure of the present invention.

Another method of achieving the terminal structure of FIG. 2 includes the use of the preformed terminal structure of FIG. 6. There is here illustrated a printed circuit cable 10 having a plurality of conductors 11 encapsulated in a plastic insulating material 16. This printed circuit cable 10 may be formed, for example, initially in a single piece from a sheet of plastic copper-clad on one side. After forming the conductors 11 in the configuration shown, the process for which will be more fully explained hereinafter, the printed circuit cable is cover-coated with insulating material except in the vicinity of the terminals 12. Folds are then made along the lines A—A′ and B—B′ to form a terminal embodiment identical to that of FIG. 2. This alternative method of forming the desired terminal configuration eliminates the grinding step.

Illustrated in FIG. 7 is a plan view of a typical multiple-conductor connector 13 showing its terminal configuration 14.

Figure 8:
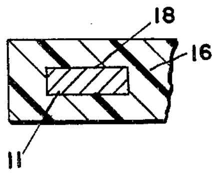
FIG. 8 is an elevational view in cross section of a typical conductor in the cable of the present invention taken along line 8—8 FIG. 1*a*.

While applicant does not intend to be limited to any particular materials in the manufacture of the article of this invention, the combination of copper conductors with poly-tri-fluoro-chloro-ethylene insulation has been found to be particularly useful. For example, the printed circuit cable may be formed from one ounce (1.37 mil) copper conductors having an adherent coating of black cupric oxide formed by oxidation in a chemical bath. These conductors are then readily laminated between two to five mil (0.002–0.005 of an inch) sheets of poly-tri-fluoro-chloro-ethylene. FIG. 8 particularly illustrates the laminate structure showing in cross section a typical copper conductor 11, its cupric oxide coating 18, and the poly-tri-fluoro-chloro-ethylene insulation 16. Other plastic materials that have been successfully employed to produce the article of this invention include polyethylene, Teflon, polyvinyl acetate and polyvinyl chloride; however, as stated above, it is believed that this principle applies broadly to all plastics and applicant does not intend to be limited to those cited in the examples.

To illustrate more completely the methods and types of materials that may be used to manufacture the article of this invention, there follow several examples of bonding copper to plastic materials.

*Tri-Fluoro-Chloro-Ethylene—Copper Article*

Figure 9:
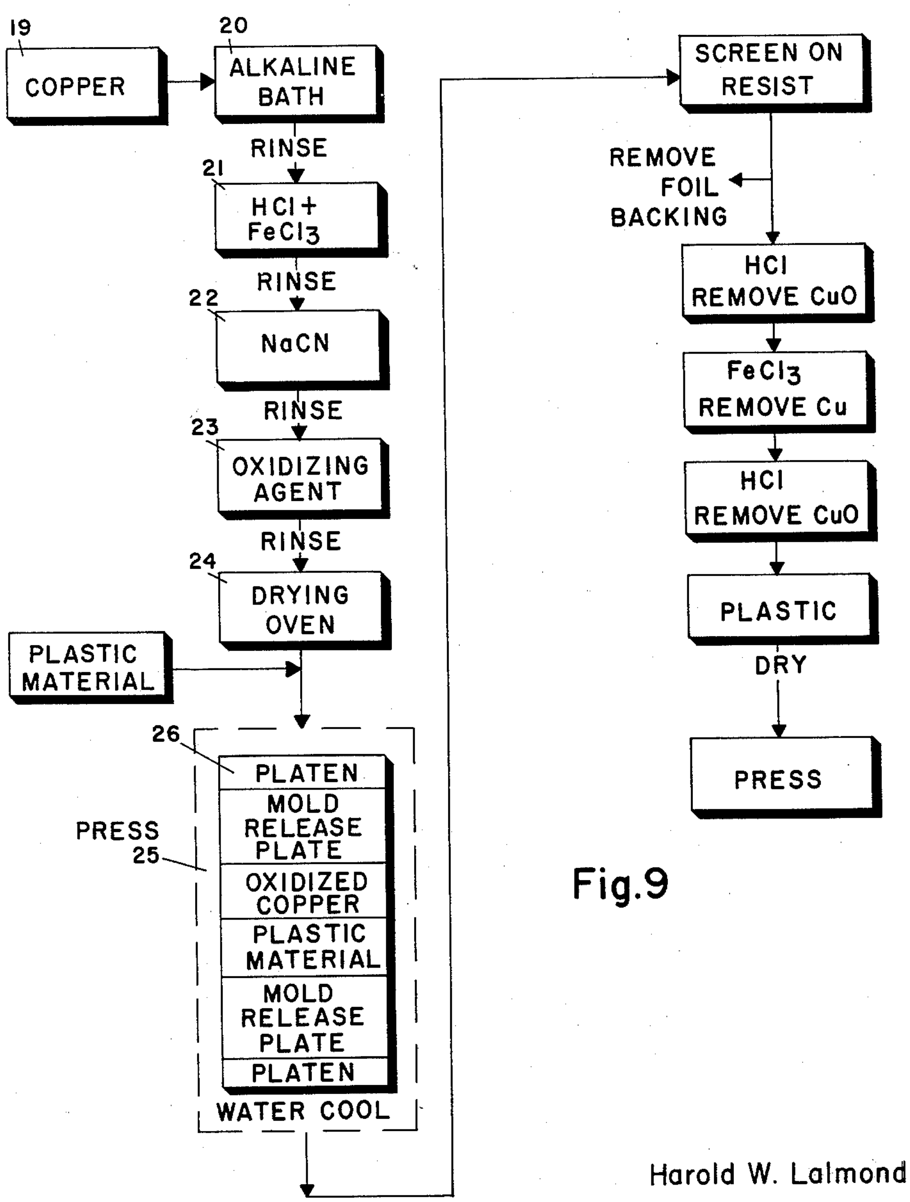
FIG. 9 is a flow chart illustrating a preferred process for manufacturing the article of the present invention.

Referring now to FIG. 9, a flow chart for a method of manufacturing a printed circuit article is illustrated. For a plastic such as tri-fluoro-chloro-ethylene, the method is carried out in detail in the following manner:

Sheets of copper 19 are:

(1) Immersed in a mild alkaline bath 20, such as Dy-Clene EW Metal Cleaner, as manufactured by MacDermid, Inc., Waterbury, Connecticut, for five seconds;

(2) Rinsed in cold, running water for five seconds;

(3) Dipped for 15 seconds in a 10 percent solution of hydrochloric acid (HCl) 21 containing a small amount of ferric chloride ($FeCl_3$);

(4) Rinsed in cold, running water for five seconds;

(5) Immersed in a 10 percent solution 22 of sodium cyanide (NaCN) for fifteen seconds and then rinsed;

(6) Immersed for 10 minutes at 190° F.–210° F. in an oxidizing agent 23, such as an aqueous solution of 1 and ½ pounds of Ebonol "C" Special, as manufactured by Enthone, Inc., New Haven, Connecticut, per gallon of water. The oxidizing agent is preferably a hot aqueous solution consisting essentially of an alkali selected from the group consisting of sodium hydroxide and potassium hydroxide and a chlorite selected from the group consisting of sodium chlorite and potassium chlorite;

(7) Immersed in cold, running water;

(8) Rinsed in hot, running water for ten to twenty seconds; and (9) Baked in a preheated oven 24 at a temperature above 212° F. until all traces of moisture are removed.

These steps result in providing a sheet of copper having a cupric oxide surface obtained by utilizing a chemical agent rather than by applying heat as in the prior art. The cupric oxide obtained in the manner described in Steps 1 to 9 above is quite different from that obtained by heating. It appears as a homogeneous, velvety black coating. The black is intense. Under a microscope of greater than 300 power, the crystals of oxide appear fine and needle-like and in a much thinner layer than that obtained when copper is heated. Further, and probably most important, this cupric oxide differs from that obtained by heating in that it is tightly bonded to the copper and will not flake off.

The copper sheets obtained by means of Steps 1 to 9 above are now ready for lamination to a plastic. The lamination process is, for example, as follows:

(10) Place a sheet of thin, metallic-foil mold release plate, such as aluminum, on the platen of a press 25, such as manufactured by Wabash Press Company, Wabash, Indiana; the aluminum foil is used to prevent adherences between the tri-fluoro-chloro-ethylene and the platen;

(11) Place a lamination of a sheet of plastic material on the platen 26 of the press 25. This lamination may have as many layers as desired, for reasons to be considered more fully hereinafter. The plastic may be, for example, tri-fluoro-chloro-ethylene and each sheet may be, for example, 6 inches long, 2 inches wide and 2 mils thick. The temperature of the oven is, for example, 400° C.;

(12) Place a sheet of copper, coated in accordance with Steps 1 to 9 on top of a tri-fluoro-chloro-ethylene layer of the laminate and apply an initial pressure of approximately 5 pounds per square inch, gradually increasing the pressure;

(13) Bake under pressure at 216° C. to 219° C. for forty seconds;

(14) Remove the copper-clad plastic from the press and quench in cold water; and

(15) Remove the aluminum foil.

This process provides a copper-clad plastic article which may be used for any of a number of purposes. Though definite pressures and temperatures are mentioned above, the pressures, times and temperatures are interrelated and vary also with the thickness, area and type of plastic material used. Generally, the temperature is in the range of 215° C. to 300° C., the initial pressure being of the order of 5 pounds per square inch but building up to higher pressures which may be of the order of hundreds of pounds per square inch. The parameters are time-temperature, primarily and, to some degree, time and temperature, in terms of the pressure applied, may be interchanged.

The plastic can, of course, be copper clad on both sides merely by placing sheets of copper both above and below the plastic. Similarly, a number of sheets of plastic may be intermixed with cupric oxide coated sheets of copper to form a laminated structure.

Another method for effecting the bond involves the use of a rotary press. The rollers are heated to a temperature of 215° C. to 250° C. and thermostatically maintained. The copper-plastic bond is effected by covering a sheet of plastic, such as tri-fluoro-chloro-ethylene with two sheets of cupric oxide coated copper and introducing the composite article between the rollers. Preferably, the rollers are spaced so as to apply a positive pressure greater than 5 pounds per square inch, and are rotated at such a rate as to provide a linear speed of, for example, 10 inches per minute, to the sheets.

A modified form of the improved method of bonding tri-fluoro-chloro-ethylene to copper involves the use of powdered tri-fluoro-chloro-ethylene which is spread on top of a sheet of cupric oxide covered copper. For unplasticized powder of high molecular weight, the operating temperature range may be as high as 300° C. After placing the powder in contact with the copper (and, if desired, applying another sheet of copper on top of the powder), the press is closed at the rate of 0.2 inch per minute until the desired thickness is obtained as determined by gauge blocks. By shining a light through the material, a color change will be observed from pink to white. After the white light appears, the press is held in place for 15 to 30 seconds, depending upon the thickness of the material desired. The composite sheet thus obtained is then quenched in cold water or transferred to a cold press. In both processes immediate quenching produces crystallization and thus a relatively high degree of transparency. The other layers of plastic can be added as desired.

The bond strengths obtained as measured by delaminating a one inch strip of copper from the tri-fluoro-chloro-ethylene are consistently greater than 8 pounds per inch. Bond strengths of 18 pounds per inch and higher are obtainable. For example, laminates prepared by starting with the tri-fluoro-chloro-ethylene powder as indicated above are characterized by bond strengths which are consistently in excess of 15 pounds per inch.

To manufacture a component of an electric circuit, the copper of the article prepared in the manner described above may be treated as indicated in the remainder of the flow chart of FIG. 9. A resist is placed on the copper in the pattern of a desired configuration and the excess removed by a suitable etching technique. The remaining resist is removed and the circuit may then be encapsulated by placing a sheet of plastic in contact with the coated copper and sealing by means of pressure in the manner described above.

*Tetra-Fluoro-Ethylene—Copper Article*

Using the same apparatus and general procedure as outlined in FIG. 9, and differing only in the plastic to copper bonding process, a thin sheet of Teflon, for example under 0.010 inch thick, is placed in contact with a sheet of cupric oxide coated copper foil, for example 2 ounce (2.7 mil) copper, and placed in the press 25. The plastic-copper laminate is preheated at approximately 700° F. for several minutes and then pressed at that temperature and in the order of 250 pounds per square inch pressure for about 6 minutes. The laminate is then water cooled in the press under continued pressure. Bond strengths have been observed as high as 8 pounds per inch.

A number of compounds which typify large classes of plastic materials have been laminated to cupric oxide coated copper in the manner suggested above. The temperature, pressure, preheat time under slight pressure, heating time under pressure, the thickness of copper used, the thickness of the plastic and the resultant peel strengths are tabulated on the following page for a number of materials utilized.

The plastic-copper bonding mechanism is not thoroughly understood. However, as a result of much experimentation and analysis, it is believed that the bonding mechanism is essentially mechanical. One basic requirement seems to be that the plastic material must flow fairly readily without decomposing. As indicated in the following table, some of the materials tend to decompose before the desired melt-viscosity is reached, even though a satisfactory bond may still be obtained. In the case of some forms of Teflon, the degree of plasticity increases with temperature but the material tends to decompose or sublimate before it reaches a suitable flow point. It will be apparent, however, that while a degree of flow is necessary to cause the plastic material to fill the interstices formed by cupric oxide needles, more or less randomly oriented, a good bond is obtainable even though ideal flow conditions are not realized. In the case of the polyvinyl material it has been frequently observed that the bond is stronger than the plastic material itself. Thus, for polyvinyl chloride and polyvinyl acetate the peel strength is indicated on the order of 3000 grams. This is the pulling force at which the plastic material broke.

*Parameters for Bonding Copper to Plastic*

| | Temp. of Materials (° C.) | Pressure (Lbs./In.²) | Time of Preheat (Min.) | Min. Time in Press (Min.) | Thickness of Copper ($10^3$ In.) | Thickness of Plastic ($10^3$ In.) | Peel Strength (Grs./In.) |
|---|---|---|---|---|---|---|---|
| Ethylenes: | | | | | | | |
| Polyethylene | 127 | 70–80 | 1 | 4 | 1.35 | ---------- | [1] >3,000 |
| Kel-F | 234 | 120–150 | 5 | 6 | 1.35 | 10 | 4,200 |
| Teflon [2] | 380 | 120–150 | 5 | 6 | 2.70 | 10 | 1,650 |
| Vinyls: | | | | | | | |
| Polyvinyl Chloride | 220 | 120–150 | 1 | 4 | 1.35 | 10 | 3,100 |
| Polyvinyl Butyral | 193 | 120–150 | 1 | 4 | 2.70 | 8.5 | 3,300 |
| Polyvinyl Acetate | 200 | 120–150 | 1 | 4 | 2.70 | 10 | 3,100 |
| Polyvinyl Alcohol [2] | 205 | 325–350 | 1 | 4 | 2.70 | 11 | 5,500 |
| Saran: | | | | | | | |
| Polyvinylidene Chloride | 180 | 120–150 | 1 | 4 | 2.70 | 12 | (3) |
| Polyvinylidene Styrene | 205 | 120–150 | 5 | 6 | 2.70 | 31 | 2,500 |
| Polyamides—Nylon NC-10 [2] | 250 | 325–350 | 5 | 6 | 1.35 | (4) | 4,000 |
| Cellulosics—Cellulose Acetate [2] | 193 | 120–150 | 1 | 4 | 2.70 | 30 | 7,260 |
| Acrylics—Methyl Methacrylate (Plexiglass)[2] | 250 | 325–350 | 5 | 6 | 2.70 | 66 | 2,000 |
| Rubber Hydroxide [2] | 122 | 120–150 | 1 | 4 | 1.35 | 9 | (5) |

[1] Tearing of polyethylene.
[2] Press—water cooled.
[3] Turned brown—tearing of material at 1,500 grams.
[4] Crystals
[5] Decomposes.

The present invention represents an important step forward in the art of printed circuitry in that the flexibility properties of plastic materials may be successfully utilized in combination with techniques of printed circuitry to produce electrical articles of superior characteristics.

While there has been described what are at present considered to be the preferred embodiments of this invention, it will be obvious to those skilled in the art that various changes and modifications may be made therein without departing from the invention, and it is, therefore, aimed in the appended claim to cover all such changes and modifications as fall within the true spirit and scope of the invention.

What is claimed is:

A method of manufacturing a printed circuit article which comprises: producing a flat, flexible, plastic, printed circuit cable having a plurality of substantially coplanar conductors embedded therein; folding said printed circuit cable, longitudinally back on itself over a spacing block; laminating said cable to said spacing block; abrading said cable at the fold to cut through said conductors, interrupting the conductive path of said conductors and forming terminals on said conductors at the outer upper surface and outer lower surface of said fold; inserting said fold and spacing block between the rows of terminals on a connector having a row of terminals in each of two parallel planes, such that said conductor terminals are in register with said connector terminals; and soldering said conductor terminals to said connector terminals to complete said printed circuit article.

References Cited in the file of this patent

UNITED STATES PATENTS 2,699,534 Klostermann ------------ Jan. 11, 1955
2,745,898 Hurd ------------------ May 15, 1956
2,748,321 Kamm ---------------- May 29, 1956
2,881,404 Kamm ------------------ Apr. 7, 1959

FOREIGN PATENTS 504,950 Belgium ---------------- Jan. 30, 1952
(Corresponding British Patent 700,490, Dec. 2, 1953.)

OTHER REFERENCES

Heck: C. R. Electrical Mfg., November 1956, pages 126–7.